(12) United States Patent
Endo et al.

(10) Patent No.: US 9,842,766 B2
(45) Date of Patent: Dec. 12, 2017

(54) SEMICONDUCTOR DEVICE AND METHOD FOR FABRICATING SEMICONDUCTOR DEVICE

(71) Applicant: Toshiba Memory Corporation, Minato-ku (JP)

(72) Inventors: Masato Endo, Yokohama (JP); Kazunori Masuda, Yokohama (JP); Yukio Nishida, Yokohama (JP); Naoya Kami, Fujisawa (JP); Yuuichi Tatsumi, Setagaya (JP); Naoyuki Kondo, Kamakura (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/607,521

(22) Filed: Jan. 28, 2015

(65) Prior Publication Data

US 2016/0056067 A1 Feb. 25, 2016

(30) Foreign Application Priority Data

Aug. 19, 2014 (JP) ................................. 2014-166783

(51) Int. Cl.
*H01L 21/768* (2006.01)
*H01L 27/11529* (2017.01)
(Continued)

(52) U.S. Cl.
CPC .... *H01L 21/7682* (2013.01); *H01L 23/53295* (2013.01); *H01L 27/11529* (2013.01);
(Continued)

(58) Field of Classification Search
CPC .......... H01L 21/7682; H01L 21/76877; H01L 27/11529; H01L 23/53295; H01L 23/5222; H01L 23/53266; H01L 27/11519; H01L 23/53238; H01L 21/768; H01L 23/522; H01L 23/528
See application file for complete search history.

(56) References Cited

U.S. PATENT DOCUMENTS

2008/0311742 A1* 12/2008 Watanabe ......... H01L 21/76816
438/675
2010/0207193 A1* 8/2010 Tanaka .............. H01L 27/11582
257/324
2013/0043523 A1 2/2013 Ohno et al.

FOREIGN PATENT DOCUMENTS

JP 2008-153480 A 7/2008
JP 2013-042068 A 2/2013
(Continued)

*Primary Examiner* — Fernando L Toledo
*Assistant Examiner* — Lawrence-Linh T Nguyen
(74) *Attorney, Agent, or Firm* — Oblon, McClelland, Maier & Neustadt, L.L.P.

(57) ABSTRACT

A semiconductor device according to an embodiment, includes a plurality of wires, a first dielectric film, and a second dielectric film. The plurality of wires are arranged above a semiconductor substrate so as to extend in a first direction and aligned via a first cavity. The first dielectric film has a plurality of portions arranged above the plurality of wires so as to extend in a second direction substantially perpendicular to the plurality of wires and aligned along the first direction via a second cavity leading to the first cavity. The second dielectric film is formed above the first dielectric film so as to cover the second cavity.

16 Claims, 14 Drawing Sheets

(51) Int. Cl.
    *H01L 23/522* (2006.01)
    *H01L 23/532* (2006.01)
    *H01L 27/11519* (2017.01)

(52) U.S. Cl.
    CPC .... *H01L 23/5222* (2013.01); *H01L 23/53238* (2013.01); *H01L 23/53266* (2013.01); *H01L 27/11519* (2013.01); *H01L 2924/0002* (2013.01)

(56) References Cited

FOREIGN PATENT DOCUMENTS

| | | |
|---|---|---|
| JP | 2013-149679 A | 8/2013 |
| JP | 2013-197533 A | 9/2013 |

\* cited by examiner

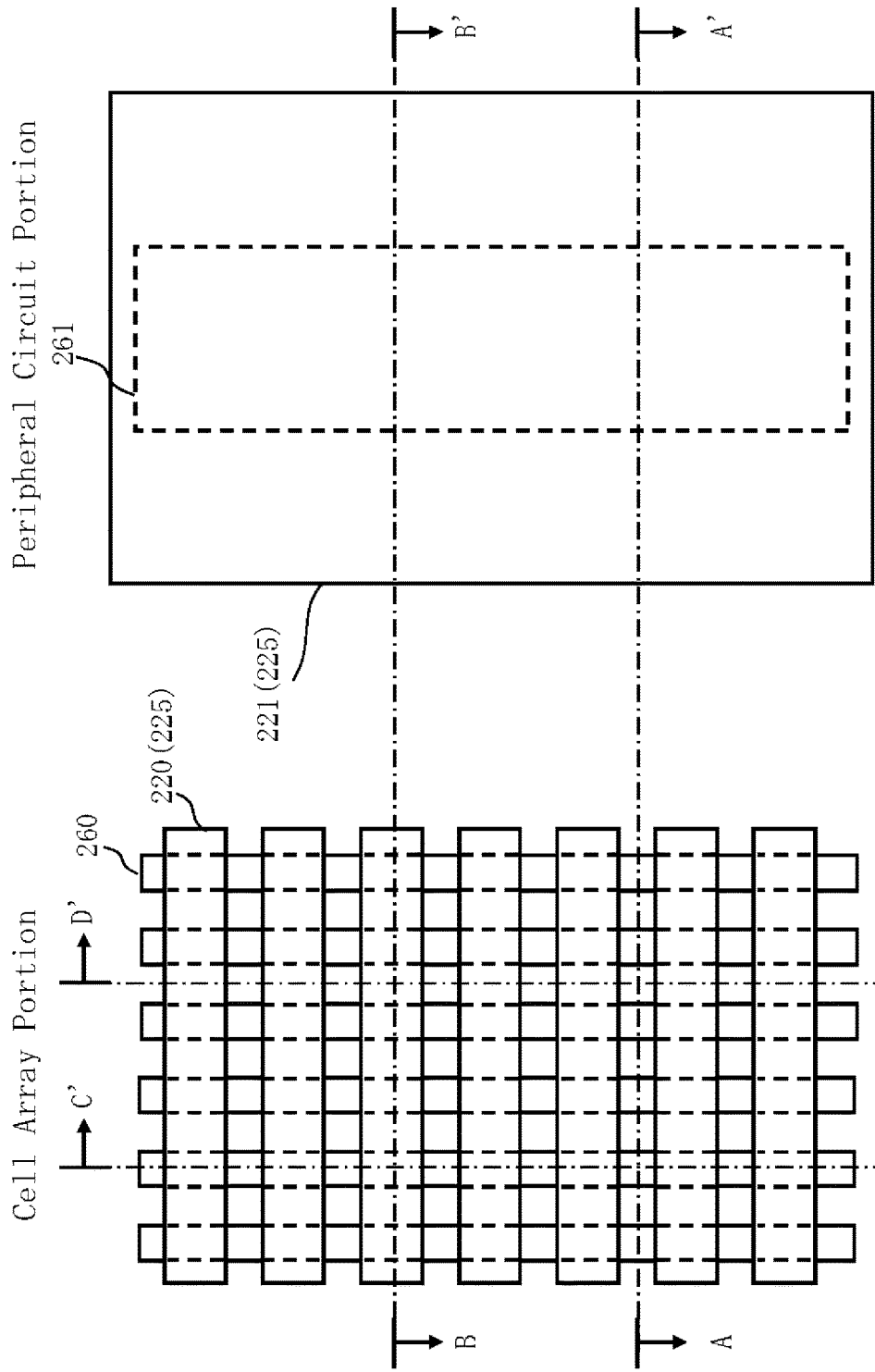

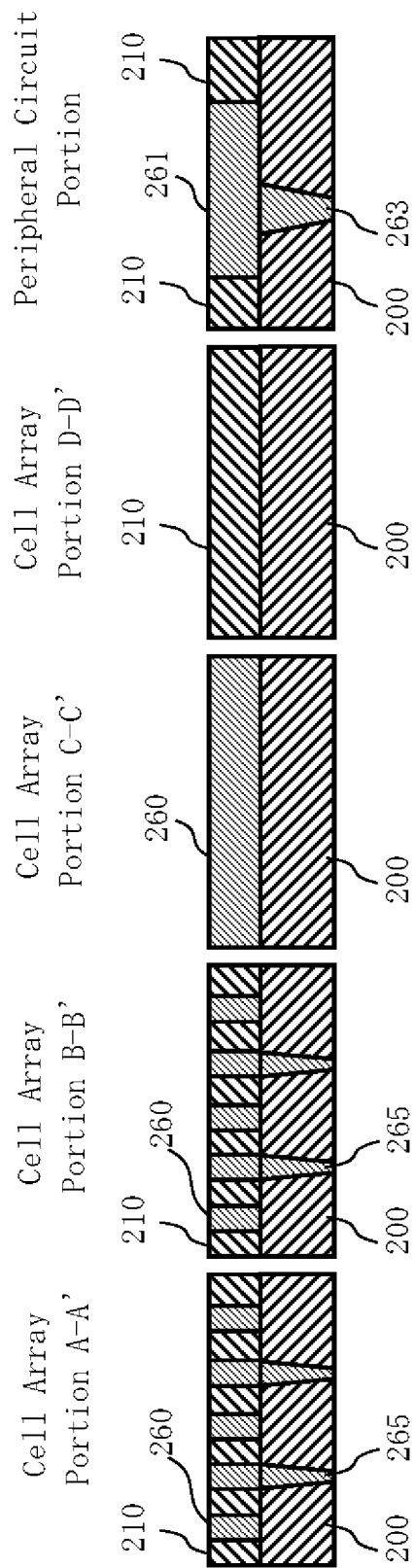

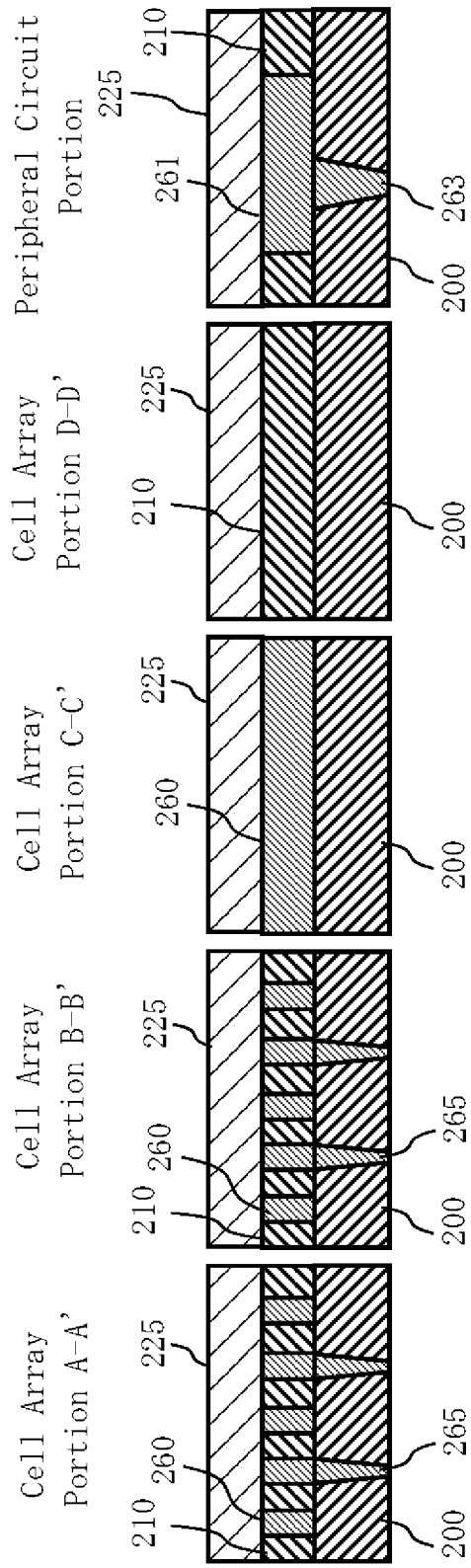

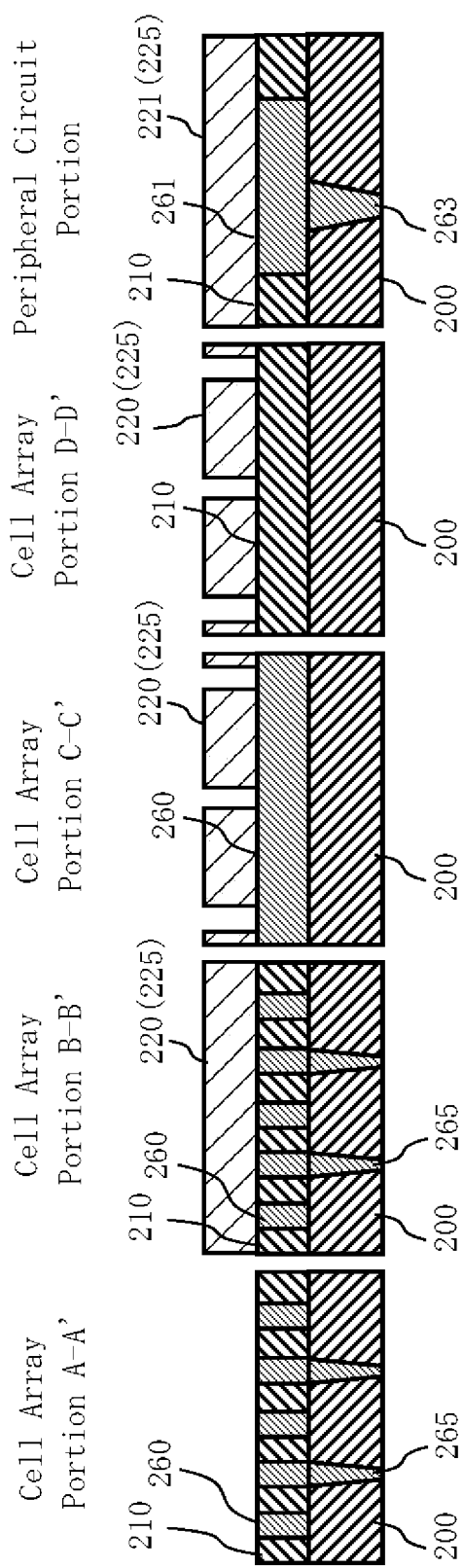

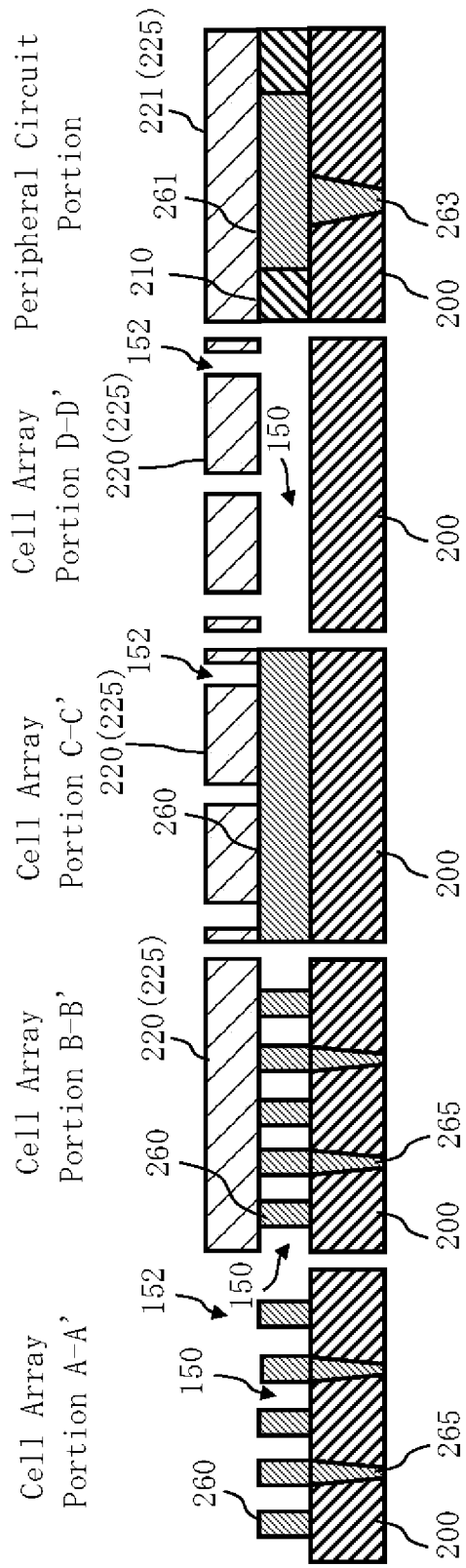

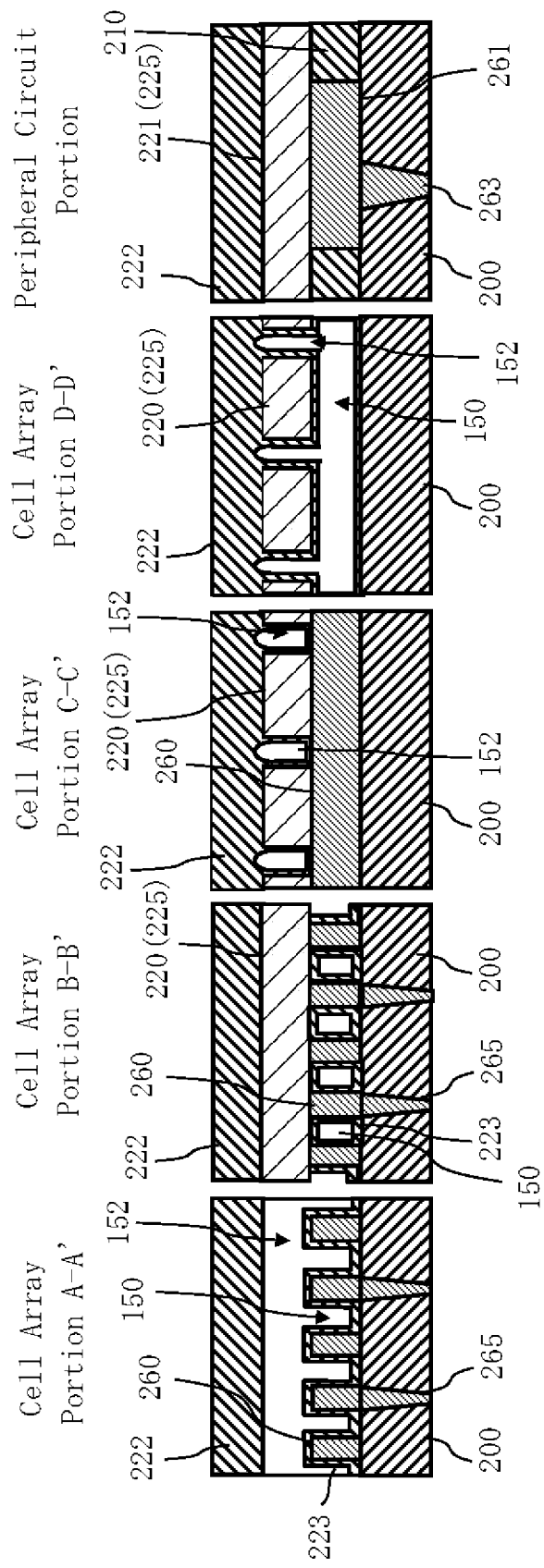

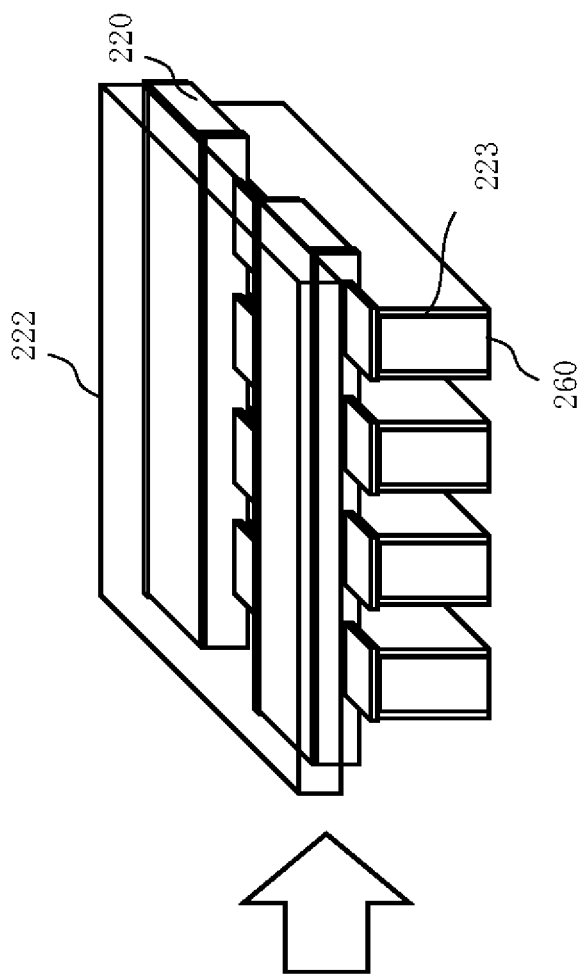
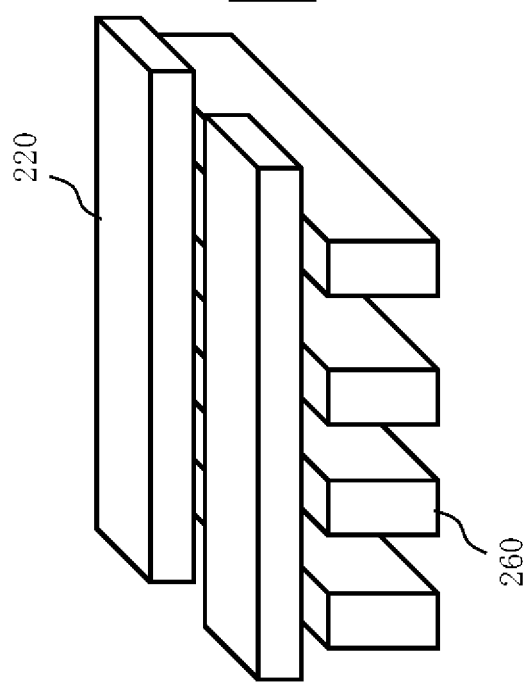

SEMICONDUCTOR DEVICE AND METHOD FOR FABRICATING SEMICONDUCTOR DEVICE

CROSS-REFERENCE TO RELATED APPLICATION

This application is based upon and claims the benefit of priority from Japanese Patent Application No. 2014-166783 filed on Aug. 19, 2014 in Japan, the entire contents of which are incorporated herein by reference.

FIELD

Embodiments described herein relate generally to a semiconductor device and a method for fabricating a semiconductor device.

BACKGROUND

In development of a semiconductor device, particularly a semiconductor memory device, ever finer patterning is developed for memory cells to achieve larger capacities and lower costs. For example, in a floating gate structure mounted semiconductor memory device such as a NAND nonvolatile semiconductor memory device, the wire pitch between bit lines (BL) formed in an upper portion of memory cells is made ever finer. Such finer patterning of LSIs is actively promoted to achieve performance improvement such as a faster operation and lower power consumption of elements due to higher integration and the reduction in manufacturing costs. In recent years, flash memories in minimum processing dimensions of, for example, 20 nm or so have been in mass production and still finer patterning and increasing technical difficulty are expected in the future.

A NAND nonvolatile semiconductor memory device capable of electrically rewriting data stores data by changing the amount of charges of a floating gate of a cell transistor to change a threshold voltage thereof. In general, electrons are discharged and injected between a floating gate and a semiconductor substrate via a gate dielectric film. Accordingly, the amount of charges of the floating gate is controlled. However, accompanying demands of finer patterning in recent years, various problems arise with increasingly finer patterning of circuits.

With finer patterning of NAND nonvolatile semiconductor memory devices, writing or reading performance deteriorates due to an RC delay of bit lines. As a countermeasure, a method of reducing an inter-wire capacity by forming an air gap between BLs is proposed. This is, for example, a method by which after bit lines are periodically formed, an upper portion thereof is covered with a dielectric film such that an air gap is formed between bit lines. According to such a method, the amount of dielectric film entering a space between bit lines is large and the volume ratio of air gaps formed between bit lines falls. Such a state cannot be considered to be enough to reduce the inter-wire capacity for finer patterning of circuits. For further performance improvements, the volume ratio of air gaps between bit lines needs to be increased. In such a case, however, a problem of a collapse of bit lines or the like is posed. Therefore, when the volume ratio of air gaps is increased, it is necessary to consider how to control such a problem.

BRIEF DESCRIPTION OF THE DRAWINGS

FIGS. 2A and 2D are diagrams showing examples of a structure of bit lines (wires) and beam member films in the first embodiment;

FIGS. 5A to 5E are process sectional views of the method for fabricating a semiconductor device according to the first embodiment;

FIGS. 6A to 6E are process sectional views of the method for fabricating a semiconductor device according to the first embodiment;

FIGS. 7A to 7E are process sectional views of the method for fabricating a semiconductor device according to the first embodiment;

FIGS. 8A to 8E are process sectional views of the method for fabricating a semiconductor device according to the first embodiment;

FIGS. 9A to 9E are process sectional views of the method for fabricating a semiconductor device according to the first embodiment;

FIGS. 10A and 10B are perspective views showing a portion of a bit line structure according to the first embodiment.

DETAILED DESCRIPTION

A semiconductor device according to an embodiment, includes a plurality of wires, a first dielectric film, and a second dielectric film. The plurality of wires are arranged above a semiconductor substrate so as to extend in a first direction and aligned via a first cavity. The first dielectric film has a plurality of portions arranged above the plurality of wires so as to extend in a second direction substantially perpendicular to the plurality of wires and aligned along the first direction via a second cavity leading to the first cavity. The second dielectric film is formed above the first dielectric film so as to cover the second cavity.

A method for fabricating a semiconductor device according to an embodiment, includes forming a plurality of wires above a semiconductor substrate so as to extend in a first direction and aligned via a sacrificial film; forming a first dielectric film above the plurality of wires and the sacrificial film so as to have a plurality of portions aligned along the first direction via a cavity above at least the sacrificial film and so as to extend in a second direction perpendicular to the first direction; removing the sacrificial film after the first dielectric film being formed; and forming, after the sacrificial film being removed, a second dielectric film above the first dielectric film so as to cover the cavity between the plurality of portions of the first dielectric film.

Hereinafter, the method of reducing the inter-wire capacity while inhibiting the collapse of wires will be described.

First Embodiment

Hereinafter, in the first embodiment, a NAND nonvolatile flash memory device with a floating gate structure will be described as an example of the semiconductor device. The semiconductor device described below is not limited to a NAND flash memory device and also applies to other semiconductor devices in which a plurality of wires is aligned. The first embodiment will be described below using the drawings.

Figures 1A, 1B:
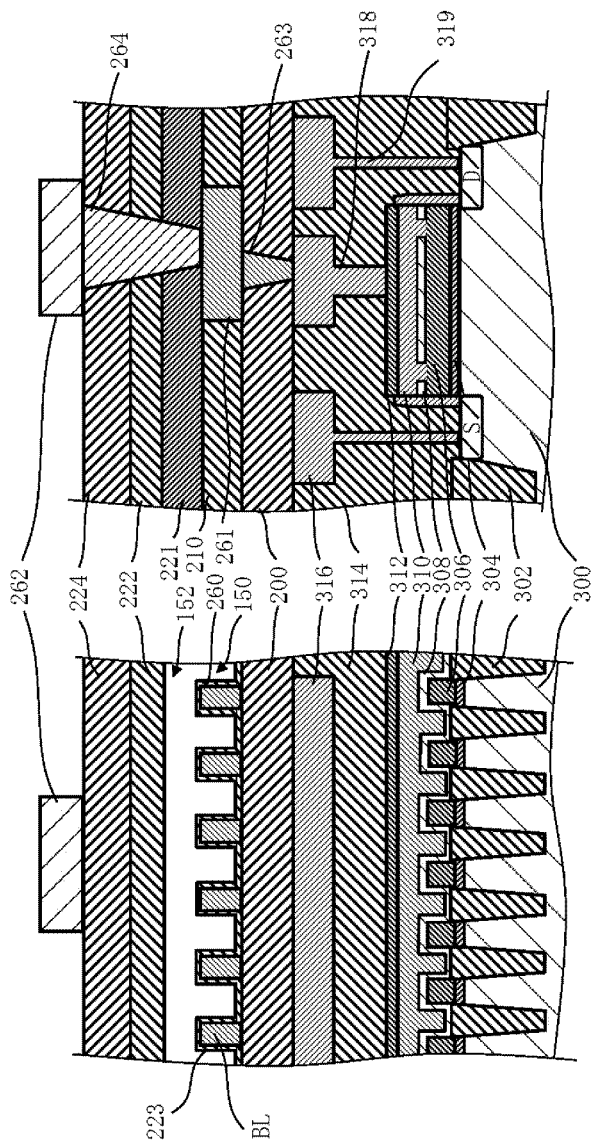
FIGS. 1A and 1B are sectional views of a semiconductor device according to a first embodiment.

FIGS. 1A and 1D are sectional views of a semiconductor device according to the first embodiment. FIG. 1A shows an example of the cross section of a memory cell region (first region) in which a gate structure to be a memory cell is formed. FIG. 1D shows an example of the cross section of a peripheral circuit region (second region) in which a peripheral circuit such as a resistance element and a MOS transistor arranged around a memory cell is formed. Particularly in FIG. 1A, the cross section cut by a surface perpendicular to the longitudinal direction of the bit line (BL) is shown.

A semiconductor substrate 300 is isolated by a plurality of element isolation dielectric films 302 embedded halfway through the substrate from the top surface. A tunnel dielectric film 304 (gate dielectric film) is formed on the semiconductor substrate 300 in each isolated element region. The tunnel dielectric film 304 is formed to a thickness of, for example, 1 to 15 nm. For the tunnel dielectric film 304, for example, a silicon oxide ($SiO_2$) film or a silicon oxynitride film is used. The $SiO_2$ film is suitably formed by, for example, heat treatment (thermal oxidation treatment) in an atmosphere of oxygen as the formation method. The silicon oxynitride film is suitably formed by, for example, combining heat treatment (thermal oxidation treatment) in an atmosphere of oxygen ($O_2$) and heat treatment (thermal nitriding treatment) in an atmosphere of nitrogen ($N_2$) as the formation method. As the semiconductor substrate 300, for example, a p-type silicon substrate made of a silicon wafer of 300 mm in diameter is used.

A silicon (Si) film 306 that becomes a floating gate (FG) in the memory cell region and a portion of a gate in the peripheral circuit region is formed on the tunnel dielectric film 304 to a thickness of, for example, 80 nm. The Si film 306 is suitably formed from a polysilicon film. An amorphous silicon film can be formed by supplying, for example, a mono-silane ($SiH_4$) gas as an Si raw gas and controlling the film forming temperature to 500 to 600° C. The amorphous silicon film is changed to a polysilicon film by a subsequent heating process. In the peripheral circuit region, a gate dielectric film and a gate may be formed by using a different material from that of the tunnel dielectric film or FG in the memory cell region.

After the tunnel dielectric film 304 and the Si film 306 are formed, a groove-like opening is formed halfway through the semiconductor substrate 300 from the top of the Si film 306 and the formed groove-like opening is filled with the element isolation dielectric film 302. Then, the dielectric film protruding from the opening is polished and removed by the chemical-mechanical polishing (CMP) method for planarization. Thereafter, the surface of the element isolation dielectric film 302 in the memory cell region is dug deeply by etching up to some height position of the Si film 306 by the etch-back method in the memory cell region. Accordingly, as shown in FIG. 1A, the aforementioned element isolation dielectric film 302 is formed up to some height position of the Si film 306 in the memory cell region. As a result, as shown in FIG. 1A, the element isolation (STI: Shallow Trench Isolation structure) between memory cells is formed. Similarly, as shown in FIG. 1B, the element isolation dielectric film 302 is arranged also on the side of elements of the peripheral circuit to be able to achieve element isolation between elements of the peripheral circuit.

In the memory cell region, an interpoly dielectric film (IPD) 308 is formed on the top surface of the Si film 306 to be FG and the side portion of the Si film 306 up to the height position of the top surface of the element isolation dielectric film 302 continuing from the top surface of the Si film like covering the Si film and also on the element isolation dielectric film 302 to a thickness of, for example, 5 to 20 nm. The IPD film 308 functions as an inter-electrode dielectric film in a gate structure in the memory cell region. Also as shown in FIG. 1B, the IPD film 308 is formed on the Si film 306. As the IPD film 308, a single dielectric film of high dielectric constant, a laminated structure of silicon oxide film/high-dielectric film/silicon oxide film, a laminated structure of silicon oxide film/silicon nitride film/silicon oxide film, or a laminated structure in which one of the above laminated structures is sandwiched between nitride films can suitably be used.

An Si film 310 is formed on the IPD film 308 by using, for example, the CVD method to a thickness of, for example, 10 to 60 nm. The Si film 310 can be formed as an amorphous silicon film by the LP-CVD method by supplying, for example, an $SiH_4$ gas as a raw material and controlling the film forming temperature to 350 to 550° C. Such an amorphous silicon film is changed to a polysilicon film by a subsequent heating process. The Si film 310 to be a polysilicon film functions as a portion of the control gate (CG).

A metal film 312 is formed on the Si film 310 by using, for example, the CVD method to a thickness of, for example, 50 nm or less. The metal film 312 functions as a remaining portion of the control gate (CG). That is, the control gate has a laminated structure in which the Si film 310 and the metal film 312 are laminated. The laminated film of the Si film 310 and the metal film 312 functions as a word line in the memory device. As the metal film 312, for example, a tungsten (W) film, a copper (Cu) film, or a nickel (Ni) film can suitably be used. Instead of the W film, a laminated film of the W film and tungsten nitride (WN) may also be used. In addition, a barrier metal film (not shown) may be formed on the bottom or the side face of the metal film 312 and as the barrier metal film, for example, titanium (Ti), tantalum (Ta), or nitride of above elements is used. The metal film 312 may also be a laminated film of a plurality of conductive films.

After the metal film 312 is formed, an opening to be a gate pattern groove is formed on both sides of the gate structure portion along the longitudinal direction of CG (word line). For example, the opening of 20 nm or less in width is suitably formed at intervals of 40 nm or less. Accordingly, the Si film 306 is separated for each memory cell along the direction perpendicular to the longitudinal direction of CG (word line) so that a floating gate (charge accumulation layer) is formed and also a control gate (CG) is processed into a word line shape. The opening is cut through from the metal film 312 up to the Si film 306 by a lithography process and a dry etching process (not shown). Then, a gate structure is formed by filling such a gate pattern groove with the dielectric film 314 or covering an upper portion thereof with the dielectric film 314 while leaving an air gap. In the peripheral circuit region, a portion of the IPD film 308 is opened to electrically connect the Si film 310 in an upper layer and the Si film 306 in a lower layer.

In this manner, a memory cell in a floating gate structure is formed in the memory cell region and a transistor is formed in the peripheral circuit region. Then, a dielectric film is formed on such a structure. For example, after a foundation film is formed, an interlayer dielectric 314 of a low-k material such as SiOC or silicon oxide ($SiO_2$) is formed. A lower wire 316 is formed in the interlayer dielectric 314. In the peripheral circuit region, for example, as shown in FIG. 1D, a gate contact 318 extending from the lower wire 316 to the gate is formed and diffusion layer contacts 319 extending from other lower wires 316 are formed to diffusion layers S, D. For the lower wire 316, the gate contact 318, and the diffusion layer contact 319, for example, a W film or a Cu film is suitably used. A barrier metal film (not shown) can be formed on the side face and the bottom of the lower wire 316, the gate contact 318, and the diffusion layer contact 319. For the barrier metal film, for example, Ti, Ta, or nitride of the above elements can be used as the material therefor.

An interlayer dielectric 200 is formed on the lower wire 316. As the interlayer dielectric 200, for example, after a foundation film of a silicon nitride (SiN) film or the like (not shown) is formed, an $SiO_2$ film or the like is suitably formed. In addition, a material of a large etching selection ratio for a sacrificial film 210 described later as a dielectric film is suitably used for the interlayer dielectric 200. Alternatively, an insulating etching stopper film of a large etching selection ratio for the sacrificial film 210 may also be suitably formed on the interlayer dielectric 200.

In the memory cell region, a plurality of bit lines 260 (wires) aligned by sandwiching (via) an air gap 150 (first cavity) therebetween is formed on the interlayer dielectric 200. In the peripheral circuit region, for example, a wire 261 formed from the same material as that of the bit line 260 is arranged in the sacrificial film 210 as a dielectric film.

FIGS. 2A and 2D are diagrams showing examples of a structure of bit lines and beam member films in the first embodiment. FIG. 2A shows an example of the structure of bit lines and beam member films in the memory cell region. FIG. 2B shows an example of the structure of a wire and a beam member film in the peripheral circuit region. In FIG. 1A, an AA' cross section in FIG. 2A is shown. In FIG. 1B, an AA' cross section in FIG. 2B is shown. As shown in FIG. 2A, a plurality of beam member films 220 (plurality of portions of a first dielectric film) as dielectric films is arranged on the plurality of bit lines 260 in contact so as to extend in a direction (second direction) substantially perpendicular to a direction (first direction) in which the plurality of bit lines 260 extend. Here, the plurality of beam member films 220 is formed so as to extend in the same direction as word lines in a memory device. Because each of the beam member films 220 is arranged so as to extend over the plurality of bit lines 260, the beam member film functions as a beam supporting between the bit lines 260 and even if the space between the bit lines 260 is the air gap 150, each of the bit lines 260 can be inhibited from collapsing. However, the angle at which the beam member film 220 is arranged is not limited to the direction perpendicular to the plurality of bit lines 260. Though the direction of 90 degrees is desirable, but may deviate from 90 degrees. However, to cause the beam to function as a beam supporting between the bit lines 260, the beam is formed so as not to be in parallel with the plurality of bit lines 260. The plurality of beam member films 220 are formed so as to be aligned along the direction in which the bit lines 260 extend, via an air gap 152 (second cavity) leading to the air gap 150. In the peripheral circuit region, on the other hand, as shown in FIG. 2B, a dielectric film 221 of the same material as that of the beam member film 220 is formed on the wire 261.

Then, a dielectric film 222 (second dielectric film) is formed on the plurality of beam member films 220 in the memory cell region so as to cover the air gap 152. In the peripheral circuit region, the dielectric film 222 is formed on the dielectric film 221. The beam member film 220 is formed on the bit lines 260 and thus, when compared with a case in which the air gap 150 of the plurality of bit lines 260 is directly covered with the dielectric film 222, the amount of the dielectric film 222 (dielectric film 223) entering the air gap 150 between the bit lines 260 can be reduced. Particularly, the beam member film 220 or the air gap 152 is present over the air gap 150 and thus, an upper portion between the bit lines 260 can be prevented from being filled with the dielectric film 222. Therefore, the volume ratio of the air gap 150 between the bit lines 260 can be increased. In addition, the air gap 152 is formed between the beam member films 220 on the bit lines 260 and thus, the wire capacity can be reduced when compared with a case in which the bit lines 260 are entirely covered.

Figure 3:
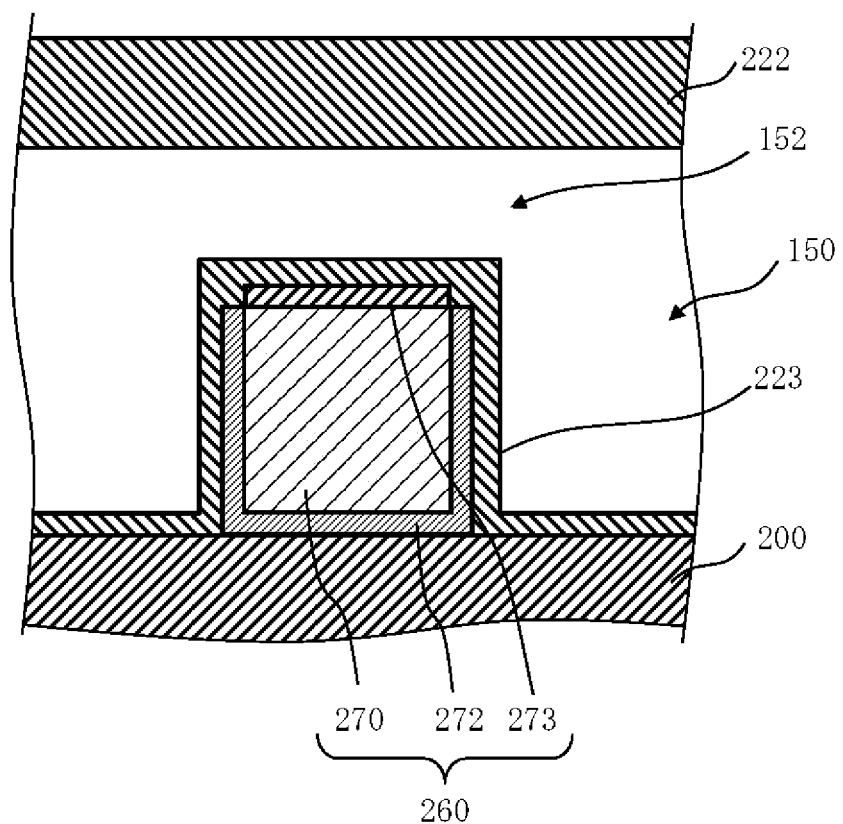
FIG. 3 is a diagram showing an example of the cross section of a bit line forming portion in the first embodiment.

FIG. 3 is a diagram showing an example of the cross section of a bit line forming portion in the first embodiment. For example, a W film or a Cu film is suitably used for a principal film 270 of the bit line 260 and the wire 261. As shown in FIG. 3, a barrier metal film 272 is formed on the side face and the bottom of the principal film 270. For the barrier metal film 272, for example, Ti, Ta, or nitride of the above elements is used as the material therefor. When a Cu film is used as the principal film 270 and a material that is hardly capable of preventing diffusion of Cu such as $SiO_2$ is used for the beam member film 220, a cap film 273 or the like for the prevention of diffusion is suitably formed selectively on the principal film 270. In the first embodiment, when the dielectric film 222 is formed, as shown in FIG. 3, a case in which a thin film of the dielectric film 223 entering the air gap 150 is formed on the top surface and the side face of the bit line 260, on the top surface of the interlayer dielectric 200, and the back side of the beam member film 220 exposed to the air gap 150 is not excluded.

A dielectric film 224 is formed on the dielectric film 222 and an upper wire 262 is formed on the dielectric film 224. In the example of FIG. 1B, a contact plug 264 formed in a laminated film of the dielectric films 221, 222, 224 and connecting the upper wire 262 and the wire 261 in the peripheral circuit region is shown. Also, a contact plug 263 formed in the dielectric film 200 and connecting the wire 261 and the lower wire 316 in the peripheral circuit region is shown. Though not shown, a NAND string structure in which a plurality of cells (gate structures) in which a source portion of one cell of adjacent cells and a drain portion of the other cell are shared is aligned in the memory cell region. Then, the drain side of the NAND string structure is connected to the bit line 260 by a contact plug (not shown) and a source potential is supplied to the source side of the NAND string structure by the lower wire 316 and a contact plug (not shown).

Figure 4:
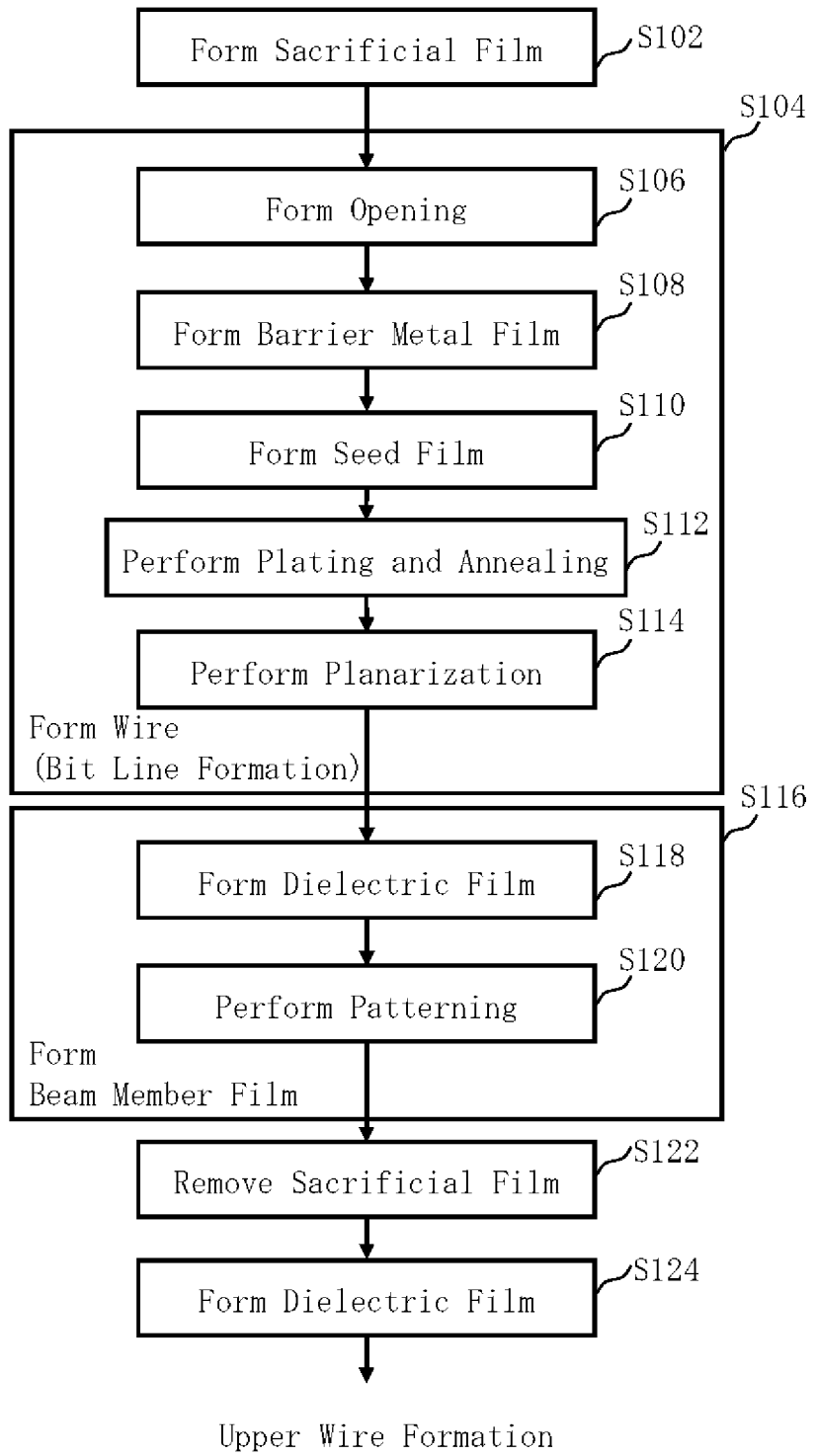
FIG. 4 is a flow chart showing principal processes of a method for fabricating a semiconductor device according to the first embodiment.
Figures 11A, 11B, 11C, 11D, 11E:
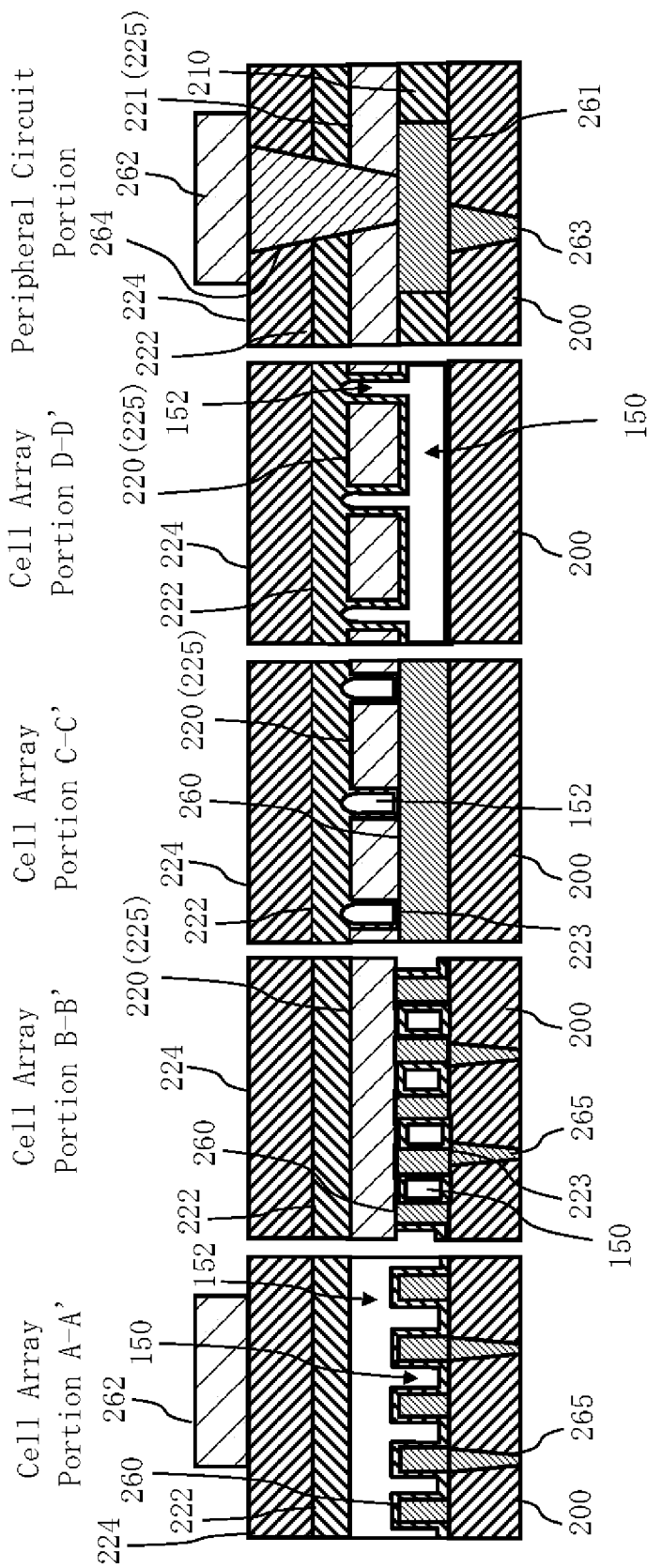
FIGS. 11A to 11E are process sectional views of the method for fabricating a semiconductor device according to the first embodiment.

FIG. 4 is a flow chart showing principal processes of a method for fabricating a semiconductor device according to the first embodiment. In FIG. 4, principal processes for forming bit line are shown. In FIG. 4, the method for fabricating a semiconductor device according to the first embodiment performs a series of processes including a sacrificial film formation process (S102), a wire formation process (S104), a beam member film formation process (S116), a sacrificial film removal process (S122), and a dielectric film formation process (S124). The wire formation process (S104) performs a series of processes as its internal processes including an opening formation process (S106), a barrier metal film formation process (S108), a seed film formation process (S110), a plating and annealing process (S112), and a planarization process (S114). The beam member film formation process (S116) performs a series of processes as its internal processes including a dielectric film formation process (S118) and a patterning process (S120).

FIGS. 5A to 5E are process sectional views of the method for fabricating a semiconductor device according to the first embodiment. Among processes shown in FIG. 4, FIGS. 5A to 5E show the sacrificial film formation process (S102) and the wire formation process (S104). Also, FIGS. 5A to 5D show an AA' cross section, a BB' cross section, a CC' cross section and a DD' cross section in the memory cell region shown in FIG. 2A. Also, FIG. 5E shows the AA' cross section in the peripheral circuit region shown in FIG. 2B. This also applies to FIGS. 6A to 9E and FIGS. 11A to 11E.

In FIGS. 5A to 5E, as the sacrificial film formation process (S102), the sacrificial film 210 is formed on the semiconductor substrate on which the interlayer dielectric 200 is formed by using, for example, the chemical vapor deposition (CVD) method to a thickness of, for example, 50 nm. The thickness of the sacrificial film 210 is suitably, for example, 10 to 100 nm. As the material of the sacrificial film 210, one of silicon nitride (SiN) and silicon oxide ($SiO_2$) is suitably used. Because, as will be described later, the sacrificial film 210 in the memory cell region is removed by wet etching, a material whose wet etching rate is fast such as a TEOS film by the LP-CVD method is suitable.

Next, as the wire formation process (S104), a plurality of bit lines 260 aligned periodically in the sacrificial film 210 is formed in the memory cell region. In the peripheral circuit region, the wire 261 is formed in the sacrificial film 210. In the first embodiment, a case when Cu is used as the material of the principal film of the bit line 260 and the wire 261 will be described. In addition to Cu, W, Ta, or Ti may be used as the principal film material of the bit line 260 and the wire 261. Alternatively, a laminated film of these elements may be used as the material. When Cu is used, Cu is processed as the material, for example, as shown below.

As the opening formation process (S106), an opening to be a wire groove is formed by cutting through the sacrificial film 210 from the surface of the sacrificial film 210 to the surface of the interlayer dielectric 200. The wire groove is formed in a width of, for example, 20 nm or less with pitches of double the width of the wire groove. An opening substantially perpendicular to the surface of the substrate can be formed by removing the exposed sacrificial film 210 by the anisotropic etching method from the substrate on which a resist pattern is formed on the sacrificial film 210 by undergoing a lithography process such as a resist application process and an exposure process (not shown). As an example, the opening may be formed by, for example, the reactive ion etching (RIE) method. A contact plug 265 connecting the bit line 260 and a lower wire or a source/drain is shown in the example of FIGS. 5A to 5E and when an opening is formed simultaneously with the bit line 260, an opening to be a via hole may be formed in the interlayer dielectric 200 by a similar method.

Next, as the barrier metal film formation process (S108), a barrier metal film is deposited on the inner wall and the bottom of the opening formed in the opening formation process (S106) and also on the sacrificial film 210 by using the sputter process to a thickness of, for example, 10 to 30 nm. Here, the barrier metal film is formed to a thickness of 10 nm. As the barrier metal film, for example, a metal such as Ti, Ta, titanium nitride (TiN), or tantalum nitride (TaN) can be used. By depositing the barrier metal film on the sacrificial film 210 to a thickness of 10 to 30 nm, the barrier metal film can be deposited on the inner wall and the bottom of the opening to a thickness of several nm.

Next, as the seed film formation process (S110), a seed film of Cu is formed on the barrier metal film along the inner wall and the bottom of the opening by the sputter process to a thickness of, for example, 10 to 20 nm. By depositing the seed film on the barrier metal film to a thickness of 10 to 20 nm, the seed film can be deposited on the inner wall and the bottom of the opening to a thickness of several nm.

Next, as the plating and annealing process (S112), the whole opening is filled with a Cu film by the electro-plating method using the seed film as a cathode. Then, after the deposition, annealing is performed, for example, at 250° for 30 minutes.

Next, as the planarization process (S114), the extra Cu film and barrier metal film protruding from the opening are polished and removed by the chemical-mechanical polishing (CMP) method for planarization to form the bit line 260 and the wire 261 shown in FIGS. 5A to 5E. When a via hole is formed in the memory cell region, the contact plug 265 can also be formed simultaneously by the so-called dual damascene method. Similarly, when a via hole is formed in the peripheral circuit region, the contact plug 263 can also be formed simultaneously by the so-called dual damascene method.

When an SiN film is used as the sacrificial film 210, as will be described later, a material that is hardly capable of preventing diffusion of Cu such as $SiO_2$ will be used for the beam member film 220. In such a case, the diffusion of Cu can be prevented by selectively forming a cap film for diffusion prevention on the Cu film. On the other hand, when an $SiO_2$ film is used as the sacrificial film 210, as will be described later, a material capable of preventing the diffusion of Cu such as an SiN film is used for the beam member film 220. In such a case, a cap film may not be formed.

Next, as the beam member film formation process (S116), a plurality of beam member films 220 (plurality of portions of the first dielectric film) aligned via the air gap 152 (second cavity) to extend in a direction perpendicular to the plurality of bit lines 260 is formed on the plurality of bit lines 260 aligned via the sacrificial film 210 and the sacrificial film 210 arranged on the semiconductor substrate.

FIGS. 6A to 6E are process sectional views of the method for fabricating a semiconductor device according to the first embodiment. Among processes shown in FIG. 4, FIGS. 6A to 6E show the dielectric film formation process (S118) of the beam member film formation process (S116).

In FIGS. 6A to 6E, as the dielectric film formation process (S118), a dielectric film 225 (first dielectric film or dielectric material film) to form the beam member films 220 is formed by using the CVD method to a thickness of 10 to 80 nm. As the material of the dielectric film 225 to form the beam member films 220, one of SiN and $SiO_2$ is suitably used. When an SiN film is used for the sacrificial film 210, an $SiO_2$ film is used for the dielectric film 225 to form the beam member films 220 to increase the etching selection ratio for the sacrificial film 210. When an $SiO_2$ film is used for the sacrificial film 210, an SiN film is used for the dielectric film 225 to form the beam member films 220.

FIGS. 7A to 7E are process sectional views of the method for fabricating a semiconductor device according to the first embodiment. Among processes shown in FIG. 4, FIGS. 7A to 7E show the patterning process (3120) of the beam member film formation process (S116).

In FIGS. 7A to 7E, as the patterning process (S120), the dielectric film 225 deposited in the dielectric film formation process (S118) is patterned (the patterning of the dielectric film 225 is performed) to form, as shown in FIG. 2, the plurality of beam member films 220 (portions of the first dielectric film) so as to extend in a direction perpendicular to the plurality of bit lines 260. An opening substantially perpendicular to the surface of the substrate can be formed by removing the exposed dielectric film 225 by the anisotropic etching method using a resist pattern as a mask from the substrate on which the resist pattern is formed on the dielectric film 225 deposited in the dielectric film formation process (S118) by undergoing a lithography process such as a resist application process and an exposure process (not shown). The width of the plurality of beam member film 220 is suitably set to, for example, three times the line width of the bit line 260 or less. From the viewpoint of inhibiting the collapse of the bit lines 260, the space width is suitably formed with ½ (half pitches) of pitches of the beam member film 220 or less and from the viewpoint of reducing the amount of dielectric film entering the air gap between the bit lines 260, the space width is suitably formed with ½ (half pitches) of pitches of the bit line 260 or less. In the peripheral circuit region, as shown in FIG. 7E, the beam member film 220 (dielectric film 221) is not patterned (the patterning of the beam member film 220 is not performed) and no opening is formed. Therefore the dielectric film 221, in which no opening is formed, remains as a portion of the dielectric film 225.

FIGS. 8A to 8E are process sectional views of the method for fabricating a semiconductor device according to the first embodiment. Among processes shown in FIG. 4, FIGS. 8A to 8E show the sacrificial film removal process (S122).

In FIGS. 8A to 8E, as the sacrificial film removal process (S122), the sacrificial film 210 between the bit lines 260 in the memory cell region is removed by, for example, the wet etching method via a space (air gap above the sacrificial film 210) between the beam member films 220. When an SiN film is used as the sacrificial film 210, phosphoric acid or the like may be used as etchant. When an SiO$_2$ film is used as the sacrificial film 210, fluoric acid or the like may be used as etchant.

If the sacrificial film 210 in the memory cell region can completely be removed including a portion immediately below the beam member film 220 shown in FIG. 8D, the wire capacity in a bit line layer can be reduced more when an SiO$_2$ film is used as the material of the beam member film 220. Conversely, if it is difficult to completely remove the sacrificial film 210 in the memory cell region including a portion immediately below the beam member film 220 shown in FIG. 8D, the wire capacity in a bit line layer can be reduced more when an SiN film is used as the material of the beam member film 220. In the peripheral circuit region, as shown in FIG. 8E, no opening is formed in the beam member film 220 and thus, the sacrificial film 210 is not removed and remains.

FIGS. 9A to 9E are process sectional views of the method for fabricating a semiconductor device according to the first embodiment. Among processes shown in FIG. 4, FIGS. 9A to 9E show the dielectric film formation process (S124).

In FIGS. 9A to 9E, as the dielectric film formation process (S124), after the sacrificial film 210 is removed in the memory cell region, the dielectric film 222 (second dielectric film) is formed on the plurality of beam member films 220 so as to cover the air gap between the plurality of beam member films 220. The dielectric film is formed by using, for example, the plasma CVD method. In the peripheral circuit region, on the other hand, the dielectric film 222 is formed on the beam member film 220 (dielectric film 221).

From the above, the air gap 150 between the bit lines 260 and the air gap 152 between the beam member films 220 are formed.

FIGS. 10A and 10B are perspective views showing a portion of a bit line structure according to the first embodiment. FIG. 10A shows a state after the sacrificial film 210 is removed and before the dielectric film 222 is formed. FIG. 10B shows a state after the dielectric film 222 is formed. Each of the beam member films 220 is arranged in a direction perpendicular to the plurality of bit lines 260 and so can support each of the bit lines 260 and inhibit the collapse of each of the bit lines 260. In addition, the amount of the dielectric film 222 (a dielectric film 223) enter the space between the bit lines 260 can be reduced by arranging the bit lines 260 and the beam member films 220 like a grid. Therefore, the volume ratio of the air gap 150 between the bit lines 260 can be increased.

FIGS. 11A to 11E are process sectional views of the method for fabricating a semiconductor device according to the first embodiment. FIGS. 11A to 11E show an upper wire formation process after the dielectric film formation process (S124) shown in FIG. 4.

In FIGS. 11A to 11E, the dielectric film 224 is formed on the dielectric film 222 and the upper wire 262 is formed on the dielectric film 224. For example, aluminum (Al) is suitably used as the material of the upper wire 262. However, the material is not limited to the above example and Cu or the like may also be used.

Figure 12:
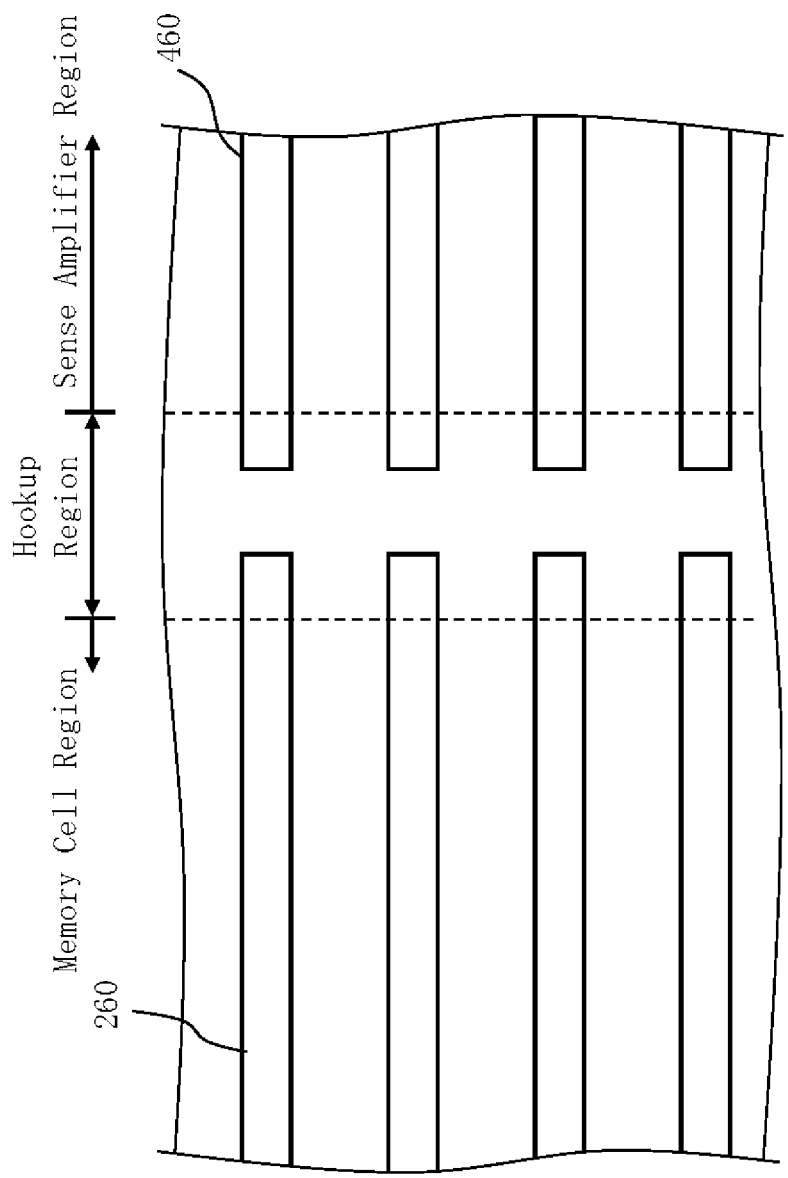
FIG. 12 is a diagram showing a portion of a circuit configuration of a memory device according to the first embodiment.

FIG. 12 is a diagram showing a portion of a circuit configuration of a memory device according to the first embodiment. In FIG. 12, the bit lines 260 formed in the memory cell region (cell array portion) and aligned with predetermined pitches extend up to a hookup region. In the hookup region, the bit lines 260 are terminated. In addition, a plurality of wires 460 extends from the hookup region to a sense amplifier region (sense amplifier portion) in the same width and pitch as those of the bit lines 260. In the first embodiment, the plurality of wires 460 in the sense amplifier region is also formed by the same formation method as that of the plurality of bit lines 260 in the memory cell region. In other words, an air gap (first cavity) similar to the air gap 150 is formed between wires of the plurality of wires 460 in the sense amplifier region. Also, a plurality of dielectric films similar to the plurality of beam member films 220 extending in a direction perpendicular to the plurality of wires 460 is formed on the plurality of wires 460. In addition, an air gap (second cavity) similar to the air gap 152 is formed between the plurality of dielectric films on the plurality of wires 460.

Figure 13A:
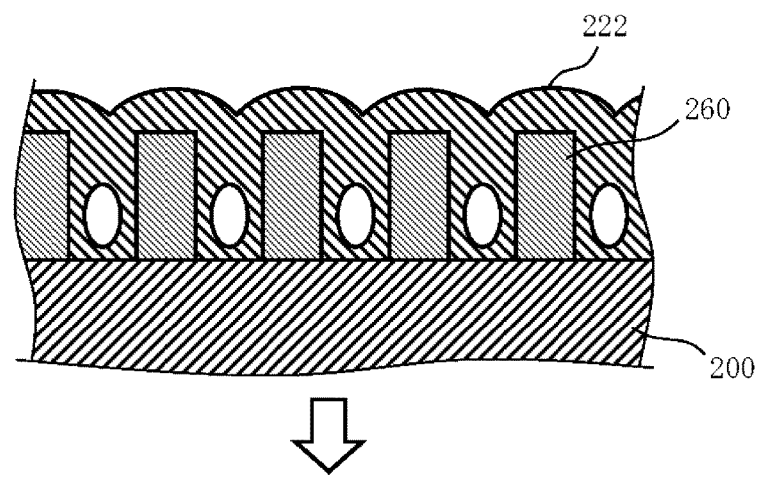
FIGS. 13A and 13B are diagrams showing sectional structures of the bit line according to the first embodiment and the bit line according to a comparative example.
Figure 13B:
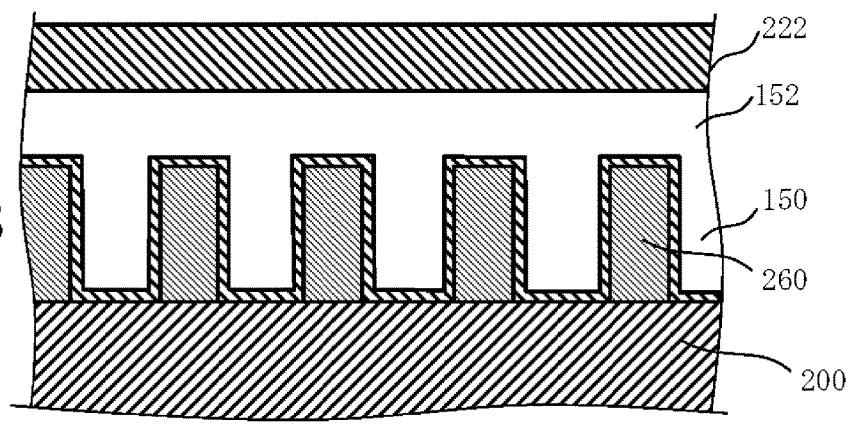

FIGS. 13A and 13B are diagrams showing sectional structures of the bit line according to the first embodiment and the bit line according to a comparative example. FIG. 13A shows a case as a comparative example when the dielectric film 222 is deposited after the sacrificial film 210 between the bit lines 260 is removed without forming the beam member film 220. In such a case, as shown in FIG. 13A, the dielectric film 222 can more easily enter the space between the bit lines 260. Particularly, an upper space between the bit lines 260 is occupied by the dielectric film 222. In the first embodiment, by contrast, as shown in FIG. 13B, the amount of the dielectric film 222 entering the space between the bit lines 260 can be reduced and the volume ratio of the air gap 150 can be increased by forming the beam member films 220.

The embodiments are described above with reference to the concrete examples. However, the embodiments are not limited to the concrete examples.

Figure 14:
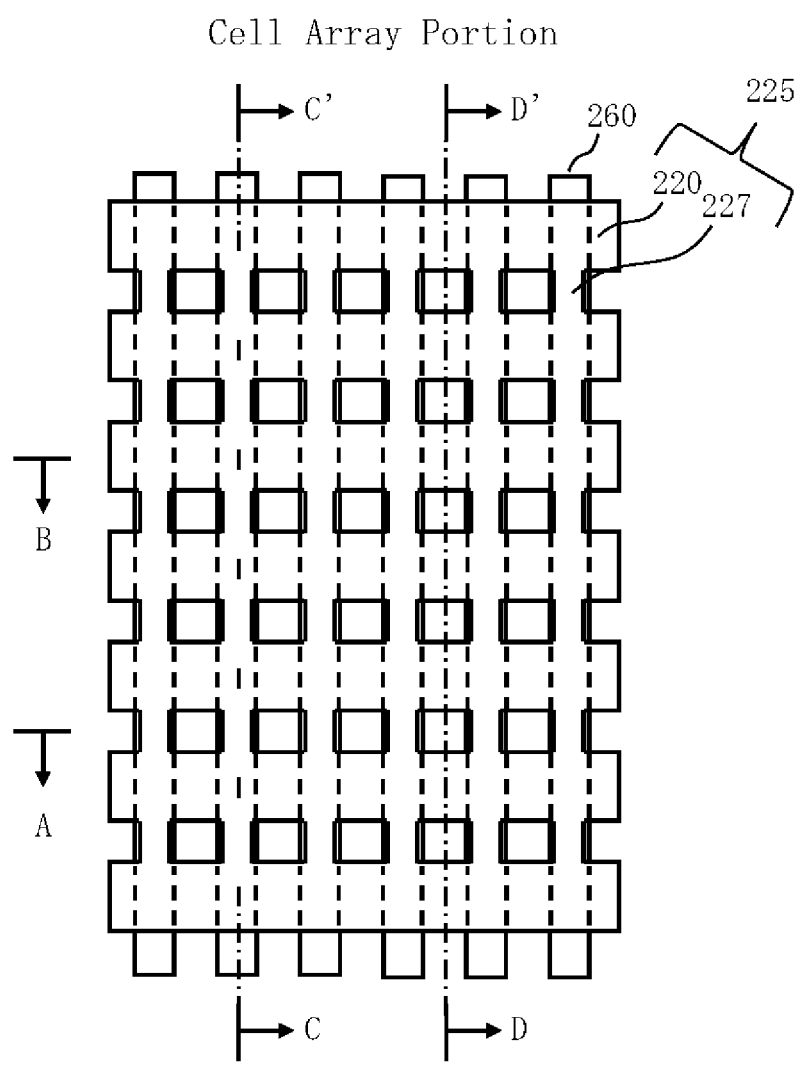
FIG. 14 is a top view showing another example of a shape of dielectric film having beam member films according to the first embodiment.

FIG. 14 is a top view showing another example of a shape of dielectric film having beam member films according to the first embodiment. The example of FIG. 2A explained a structure in which a plurality of beam member films 220 each of which is separated to each other in the memory cell region is arranged. However, the structure is not limited to this example. As shown in FIG. 14, the dielectric film 225 may be performed pattern forming in a reticular pattern by the plurality of portions 220 arranged on the plurality of bit lines 260 in contact aligned in a direction in which the plurality of bit lines 260 extend, and by a plurality of portions 227 arranged to connect the plurality of portions 220 on the bit lines 260. In addition, the width of the plurality of portions 227 may be the same as the width of the bit lines 260 or may be smaller than the width of the bit lines 260. In a case of forming a pattern in a reticular pattern, a dielectric film 222 becomes hard to enter the air gap 150 of the plurality of bit lines 260, and the effect of reducing a volume among the plurality of bit lines 260 can be expected. On the other hand, no air gap 152 cannot be formed at all due to serial presences of the dielectric film 225 (portion 227) on the bit lines 260. Accordingly, the beam member structure arranged in a line as shown in the example of FIG. 2A is preferable taking consideration of the capacity between each of the bit lines 260 and an unillustrated upper wire.

In addition, all semiconductor devices and all methods for fabricating a semiconductor device that include elements of the embodiments and whose design can be changed as appropriate by persons skilled in the art are included in the scope of the embodiments.

While techniques normally used in the semiconductor industry such as cleaning before and after treatment are not described for convenience of description, it is needless to say that such techniques can be included in the scope of the embodiments.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. A semiconductor device comprising:
  a plurality of wires arranged above a semiconductor substrate so as to extend in a first direction with a plurality of first cavities formed between the plurality of wires;
  a first dielectric film having a plurality of portions arranged above the plurality of wires so as to extend in a second direction substantially perpendicular to the plurality of wires and aligned along the first direction via a second cavity leading to the plurality of first cavities, the second cavity being arranged above the plurality of first cavities; and
  a second dielectric film formed above the first dielectric film so as to cover the second cavity,
  wherein a width of the second cavity between the plurality of portions of the first dielectric film is half a pitch of the plurality of portions or less.

2. The device according to claim 1, wherein the first and second cavities are formed in a memory cell region and a sense amplifier region.

3. The device according to claim 1, wherein one of silicon nitride and silicon oxide is used as a material of the first dielectric film.

4. The device according to claim 1, wherein the semiconductor device is a memory device with a floating gate structure and
  the plurality of wires are bit lines of the memory device.

5. The device according to claim 4, wherein the plurality of portions of the first dielectric film extends in a same direction as word lines of the memory device.

6. The device according to claim 1, wherein the width of the second cavity between the plurality of portions of the first dielectric film is half a pitch of the plurality of wires or less.

7. The device according to claim 1, wherein a width, along the first direction, of the plurality of portions of the first dielectric film is three times a width of the plurality of wires or less.

8. The device according to claim 1, wherein a first layer having the first dielectric film and in which the second cavity is formed is arranged above a second layer having the plurality of wires and in which the plurality of first cavities is formed.

9. The device according to claim 1, wherein the plurality of portions of the first dielectric film are arranged above the plurality of wires and the plurality of first cavities between the plurality of wires.

10. A semiconductor device comprising:
  a plurality of wires arranged above a semiconductor substrate so as to extend in a first direction with a plurality of first cavities formed between the plurality of wires;
  a first dielectric film having a plurality of portions arranged above the plurality of wires so as to extend in a second direction substantially perpendicular to the plurality of wires and aligned along the first direction via a second cavity leading to the plurality of first cavities, the second cavity being arranged above the plurality of first cavities; and
  a second dielectric film formed above the first dielectric film so as to cover the second cavity,
  wherein a width, along the first direction, of the plurality of portions of the first dielectric film is three times a width of the plurality of wires or less.

11. The device according to claim 10, wherein the first and second cavities are formed in a memory cell region and a sense amplifier region.

12. The device according to claim 10, wherein one of silicon nitride and silicon oxide is used as a material of the first dielectric film.

13. The device according to claim 10, wherein the semiconductor device is a memory device with a floating gate structure and
  the plurality of wires are bit lines of the memory device.

14. The device according to claim 13, wherein the plurality of portions of the first dielectric film extends in a same direction as word lines of the memory device.

15. The device according to claim 10, wherein a first layer having the first dielectric film and in which the second cavity is formed is arranged above a second layer having the plurality of wires and in which the plurality of first cavities is formed.

16. The device according to claim 10, wherein the plurality of portions of the first dielectric film are arranged above the plurality of wires and the plurality of first cavities between the plurality of wires.

* * * * *